United States Patent [19]

Fan et al.

[11] Patent Number: 5,021,119

[45] Date of Patent: Jun. 4, 1991

[54] ZONE-MELTING RECRYSTALLIZATION PROCESS

[75] Inventors: John C.C. Fan, Chestnut Hill; Paul M. Zavracky, Norwood, both of Mass.; Jagdish Narayan, Raleigh, N.C.; Lisa P. Allen, Norton; Duy-Phach Vu, Taunton, both of Mass.

[73] Assignee: Kopin Corporation, Taunton, Mass.

[21] Appl. No.: 600,246

[22] Filed: Oct. 18, 1990

Related U.S. Application Data

[63] Continuation of Ser. No. 385,661, Jul. 26, 1989, abandoned, which is a continuation of Ser. No. 120,016, Nov. 13, 1987, Pat. No. 4,885,052.

[51] Int. Cl.$^5$ .............................................. C30B 13/00
[52] U.S. Cl. ..................... 156/620.71; 156/620.7; 156/620.72; 156/DIG. 64; 156/DIG. 73; 156/DIG. 80
[58] Field of Search ............... 156/605, 606, 603, 624, 156/612, 620.71, 620.7, 620.72, DIG. 64, DIG. 73, DIG. 80; 437/16, 18, 20, 21, 24; 148/DIG. 83, DIG. 82

[56] References Cited

U.S. PATENT DOCUMENTS

| | | | |
|---|---|---|---|
| 4,177,084 | 12/1979 | Lau et al. | 437/24 |
| 4,330,363 | 5/1982 | Biegesen | 156/620 |
| 4,371,421 | 1/1983 | Fan et al. | 156/624 |
| 4,463,492 | 8/1987 | Maeguchi | 437/21 |
| 4,479,846 | 10/1984 | Smith et al. | 156/603 |
| 4,509,990 | 4/1985 | Vasudev | 148/1.5 |
| 4,522,657 | 6/1985 | Rohatgi et al. | 437/24 |
| 4,545,823 | 10/1985 | Drowley | 156/612 |
| 4,561,916 | 12/1985 | Akiyama et al. | 148/175 |
| 4,588,447 | 5/1986 | Golecki | 156/624 |
| 4,632,712 | 12/1986 | Fan et al. | 148/175 |
| 4,693,758 | 9/1987 | Kobayashi et al. | 437/174 |

FOREIGN PATENT DOCUMENTS

| | | | |
|---|---|---|---|
| 88/04028 | 6/1989 | European Pat. Off. | 87/04854/081987dex |
| 54-47473 | 4/1979 | Japan | 437/20 |
| 56-33821 | 4/1981 | Japan | 437/21 |
| 87/04563 | 7/1987 | United Kingdom . | |

OTHER PUBLICATIONS

"Characteristics of Ion-Implantation Damage and Annealing Phenomena in Semiconductors", Narayan et al., J. Electrochem. Soc., Solid-State Science and Technology, vol. 131, No. 11, Nov. 1984, pp. 2651-2662.
Appl. Phys. Lett.; vol. 37, No. 5, 1 Sep. 1980; "Silicon Graphoepitaxy Using a Strip-Heater Oven"; Geis et al.; pp. 454-455.
Appl. Phys. Lett.; vol. 38, No. 3, 1 Feb. 1981; "Laser-Induced Crystallization of Silicon Islands on Amorphous Substrates: Multilayer Structures"; Biegelsen et al.; pp. 150-152.
Silicon Processing for the VLSI Era; vol. 1; Wolf and Tauber; pp. 305-308.
VLSI Technology; Edited by Sze; pp. 220-224.

Primary Examiner—Patrick P. Garvin
Assistant Examiner—R. Bruce Breneman
Attorney, Agent, or Firm—Hamilton, Brook, Smith & Reynolds

[57] ABSTRACT

A method for reducing defects after zone melting and recrystallization of semiconductor films formed on an insulator over a semiconductor substrate by selectively removing portion of a first layer over the semiconductor film, amorphizing the exposed film portion and laterally regrowing the amorphized region.

10 Claims, 2 Drawing Sheets

ZONE-MELTING RECRYSTALLIZATION PROCESS

This is a continuation of co-pending application Ser. No. 07/385,661, filed on July 26, 1989, now abandoned, which is a continuation of Ser. No. 07/120,016, filed on Nov. 13, 1987, now U.S. Pat. No. 4,885,052.

BACKGROUND ART

Zone-Melting Recrystallization (ZMR) is a process for producing thin crystalline films of--Silicon--(Si) isolated from a silicon substrate by a buried insulating layer, i.e., $SiO_2$. In the ZMR process a layer of $SiO_2$ is deposited on a substrate, often a single-crystal wafer. Polycrystalline Si (polysilicon) is then deposited on the $SiO_2$ layer; followed by deposition of a capping layer or a wetting agent, such as, $SiO_2$.

This structure is then subjected to a heat treatment wherein the polysilicon film is melted.

Typically, the heating is performed using a stationary bottom heater adjacent the substrate surface. The stationary heater elevates the temperature of the polysilicon to about 1000° C.–1300° C., near its melting point. A movable upper heating source is then translated past the structure adjacent the capping film to supply sufficient heat to melt the polysilicon as the heating source moves along its path. Upon recrystallization the polysilicon film is transformed to a single, or nearly single crystalline film. Optionally, a single crystal seed material may be used to aid in epitaxial recrystallization (See U.S. Pat. No. 4,371,421 to Fan et al. and "Silicon Graphoepitaxy Using a Strip-Heater Oven" by M. W. Geis et al. Applied Physics Letters, 37-- (5) Sept. 1, 1980).

Silicon-on-Insulator --(SOI)-- material prepared by the ZMR technique promises to satisfy the material needs for many important device applications, including radiation-hardened circuits, high voltage circuits, faster computating circuits, and microsensors etc. Currently, however, ZMR processed SOI wafers have several significant material problems that can potentially limit their wide-spread adoption. The major problems are associated with one or more of the following: surface-edge defects, sub-boundary defects, surface defects, and "warps & slips".

DISCLOSURE OF THE INVENTION

An improved process of ZMR is provided wherein the conventional single upper movable heater is supplemented by lateral fore and aft heaters to provide a shallow thermal gradient. Additionally, defect entrainment strips are formed on the upper encapsulating film so that after ZMR the entrapped defects can be located by etching away the strips. Once located the defect area is amorphized and re-grown as single crystal defect free material from the sides These and other improvements will be described in connection with the drawings.

DETAILED DESCRIPTION OF THE INVENTION

Figure 1:
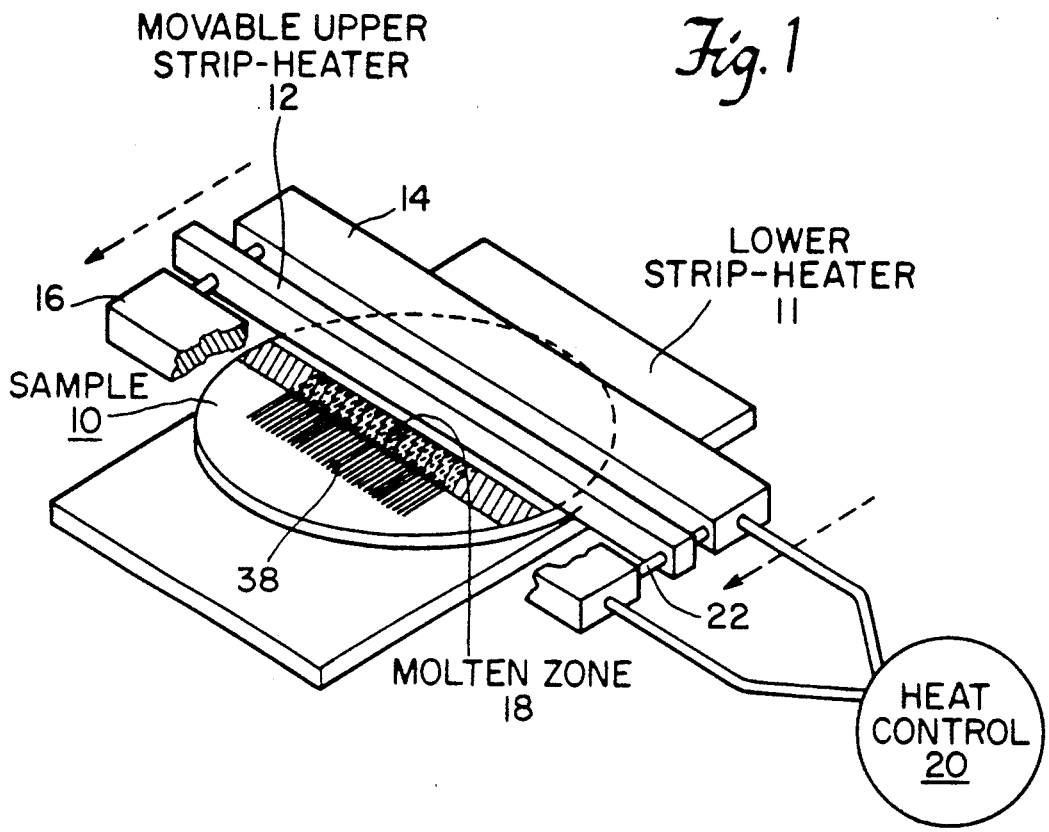
FIG. 1 is a partially cut-away illustration of the ZMR heaters
Figure 2:
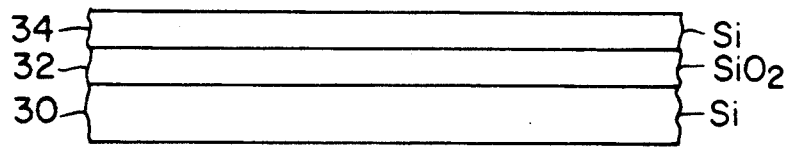
FIGS. 2–5 are successive schematic cross-sectional views of the ZMR process.

--Surface-edge-- defects are caused by overheating around the edge of a wafer. Under uniform bottom-heater conditions, the upper heater often heats the edges much hotter. The overheating causes the wafer edges to melt and thus causes detrimental effects to photolithography. This is a problem even without seeding. If seeding is used, and the seeding is often done along the edges, the seeding areas (either by scribing, or photolithography) will also often cause either overheating, or other cosmic surface effects, thus affecting device photolithography.

The exact nature of the sub-boundary defects is not known. They may be attributable to thermal or mechanical vibrations in the ZMR process coupled with the sharp thermal gradients, and oxygen presence in the wafers. Nevertheless, it has been observed that the sub-boundaries currently disappear with Si layers thicker than 5 microns, and these sub-boundaries are replaced by dislocation arrays, still located approximately where the sub-boundaries were. The dislocation densities (estimated to be $10^5$–$10^6 cm^{-2}$) are mostly threading dislocations. In between these regions, the Si film was found to be essentially defect-free. Sub-boundaries have detrimental effects on gate oxidation and leakage currents in devices. Threading dislocations usually have less detrimental effects than sub-boundaries for devices. However they still may have detrimental effects on yields in circuits Protrusions are surface defects usually located at the sub-boundaries or grain boundaries. Surface protrusions (usually about a few microns across) have adverse effects on photolithography and gate oxidation during device processing.

ZMR wafers often exhibit "slips" in the wafers. They appear to be caused by sharp thermal gradients present in the typical ZMR process. These "slips" are measured to be about a few hundred Å in ZMR samples, causing possible photolithography problems. The "warps" also appear to be caused by the sharp thermal gradients. They are measured to be tens of microns across a 4" or 5"-diameter wafer.

The present invention comprises a series of processing steps which can be combined to provide much improved ZMR wafers and higher processing yield. Inclusion of some or all the steps is a matter of choice depending upon the particular requirements. The improvement steps are as follows:

I. EDGE EFFECTS

A quick and easy method for reducing edge effects is to cut the ZMR wafers to a smaller size thus eliminating all the edge effects. For example a 5"-diameter wafer can be obtained by trimming a 6"-diameter wafer. The cutting method can be either laser, mechanical, or ultrasonically. Sand blasting is also very effective. The detailed sand blasting process is outlined as follows:

A ZMR processed wafer is mounted on a jig and $Al_2O_3$-powder-blasted at a velocity of about 0.02m/sec, with $Al_2O_3$ of 27 micron sieve size. The $Al_2O_3$ is ejected from a nozzle of about 35 mil diameter with a pressure of 80 PSI The --. and the important wafer surface i.e. the wafer area away from the edge is protected by an adhesive tape. The wafer is placed about 25 mil from the nozzle. The actual cutting time is less than 90 seconds. By cutting off the edges, desirable stress relief effects have also been observed, and warping is significantly reduced.

II. SUB-BOUNDARIES

Currently sub-boundaries occur in Si films of less than 0.5 microns in thickness. It is therefore desirable to prepare ZMR samples with Si films greater than 0.5 microns thick so as to obtain films without sub-boundaries. Then the thick film is then thinned down for actual device applications. Nte: In some device applications, especially for large-scale integrated circuits with small device geometries, a thin Si film is preferred having a thickness of less than 0.3 microns. Thinning the films is preferably accomplished by polishing as follows: The polishing powder used is Syton, with adhesive backing to a polishing pad. A very smooth parallel plate polishing technique must be used to assure a parallel Si film after polishing. Usually polishing also removes and reduces surface protrusion effects. Alternatively, reducing Si film thickness is accomplished by oxidation followed by etching. Either high pressure or low pressure oxidation is employed. The oxidation process must be carefully carried out to retain surface smoothness and uniformity. It can be done with steam oxidation at 950° C., or a dry oxidation in oxygen at 1200° C. With dry oxidation, the oxidation rate is about 4000Å of $SiO_2$ in 3.5 hours. There is another advantage to dry oxidation; in that it may be combined with high-temperature annealing (to be described later).

For other device applications, such as bipolar, thick films are acceptable, and no thinning is needed.

III. WARP & SLIPS

To reduce warping and slips, a shallow thermal gradient method is used. Shallow thermal gradients are obtained by using two additional upper heaters 14 and 16 (See FIG. 1) laterally disposed before and after the movable upper heater 12 and translatable therewith.

These two additional upper heaters ideally should be separately thermally controlled and of substantially greater lateral width than the thin single upper heater to provide more symmetrical thermal input in the ZMR process, allowing better process control.

IV. THREADING DISLOCATIONS

In ZMR films, as above noted, sub-boundaries and threading dislocations are often observed. The exact causes of such crystal defects have not been established. However, it is known that they are present in locations where the recrystallized films are the last to solidify. Previously, the sub-boundaries or dislocations have been entrapped into preselected locations. (See for example, U.S. Pat. No. 4,479,846 to Smith et al. issued 30 Oct. 1984, which teaches use of an artificial pattern to entrain boundaries.) One such pattern may comprise a periodic raised structure of parallel strips in the underlying $SiO_2$ of the SOI structure. This makes the Si films along these raised structures slightly hotter than the adjacent areas, and thus they become the last area to solidify. Therefore, by having a periodic $SiO_2$ structure, the dislocations or sub-boundaries are localized in preselected areas. Unfortunately, the raised structure in the underlying $SiO_2$ also causes the Si films to have undulating features, which are very detrimental to device fabrication.

Another technique of entrainment is shown in Smith et al. above. In Smith et al. parallel strips of material are formed on the encapsulating layer over the polysilicon. The strips may either be a reflectional coating to thermal or light radiation or may be an absorber. In this former case, the sub-boundaries or defects are entrained away from the shaded strips and in the latter are entrained beneath the strips.

V. ZMR PROCESS

Referring now to FIG. 1 the process and apparatus for improved ZMR will be described in more detail in connection therewith.

Figure 5:
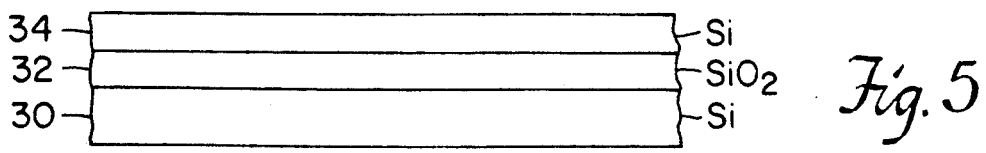
Figure 6:
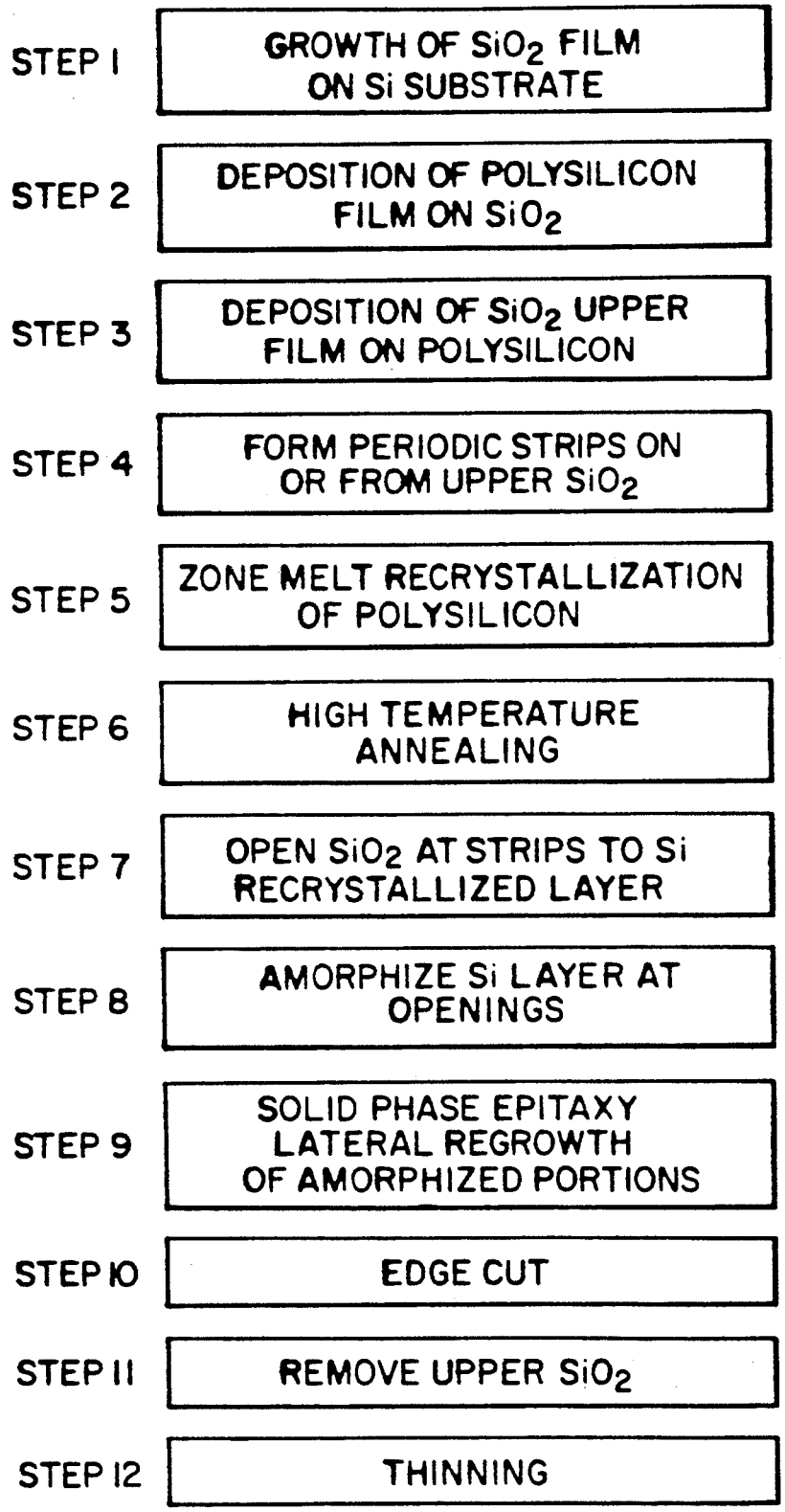
FIG. 6 is a flow chart of the improved ZMR process.

In the partially exploded view of FIG. 1 and the successive sectional views of FIGS. 2-5, and process chart of FIG. 6, the basic concepts of improved ZMR are shown. A sample wafer 10 is subjected to a thermal treatment by being disposed on a stationary lower strip-heater 11 while a movable upper strip heater 12 is mechanically translated past the sample 10 in the direction of the arrows In accordance with the present invention fore and aft heaters 16 and 14 respectively are mechanically coupled to the conventional upper heater 12 and are mechanically translatable therewith. For example, rods or pins 22 may be used to couple the heaters together Leads 26 and 28 are coupled to heat control unit 20 so that the temperature of heaters 14 and 16 may be controlled separately from each other and from the other units. The purpose of heaters 14 and 16 is to provide a less abrupt, more shallow, thermal gradient as the main upper strip heater 12 is translated past the sample. For example, if the lower heater is maintained at 1100° C. the upper heater 12 is set at about 1600° C. while the fore heater 16 is at 1300° C. and the aft heater at 1400° C.

Under these conditions the top wafer surface first sees a temperature of about 1300° C. before encountering the elevated temperature of the main heater 12.

Figure 3:
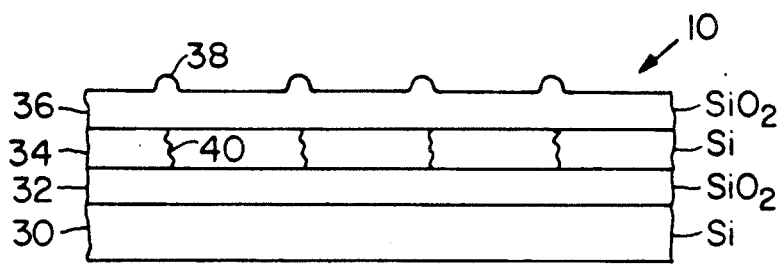
Figure 4:
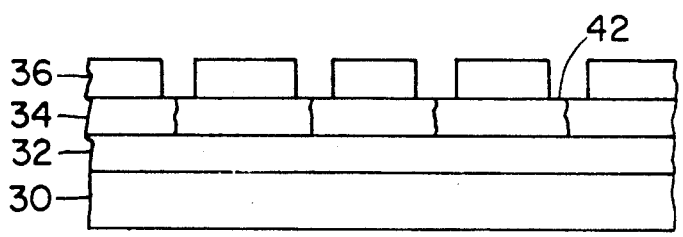

The wafer 10 is preferably comprised of a single crystal Si substrate 30 upon which a thermally grown layer 32 of $SiO_2$ is formed. (Step 1 FIG. 6) A thin film of polysilicon 34, to be recrystallized, is then deposited on the $SiO_2$ film 32. (Step 2 FIG. 6 and FIG. 2). An encapsulation or wetting agent layer 36 of $SiO_2$ (or $Si_3N_4$, or both) is formed, as by deposition. (Step 3 FIG. 6) A periodic entrainment pattern of raised strips 38 is then formed on, or in, the encapsulation layer 36. Preferably these strips are formed by etching away $SiO_2$ material from layer 36 between the desired strip locations. (Step 4 FIG. 6) The structure at this point is shown in the section of FIG. 3 and has the advantage that, when the wafer $SiO_2$ layer 36 is subsequently removed by etching; a planar upper layer of Si is left. (See FIG. 5).

The structure thus formed is then subjected to the ZMR process; (Step 5 FIG. 6) whereby a molten zone 18 is created in the polysilicon film 34. This molten zone is moved in a direction parallel to the axis of the entrainment pattern as shown by the arrows in FIG. 1. The molten zone is long and narrow with its long axis perpendicular to the lines of the entrainment pattern. As the molten zone recrystallizes, the polysilicon film 34 is transformed to single crystal, or nearly single crystal silicon, with crystal defects 40 primarily located beneath the strips 38 (See FIG. 3).

The structure shown in FIG. 3 is then subjected to a high temperature anneal in an oxygen ambient at about 1200°-1300° C. Low angle grain boundaries, or sub-boundary, defects are reduced by this treatment; that is, individual sub-grains are better aligned with each other. In addition stacking faults and twins are found to be eliminated or much reduced with this annealing step. Using X-ray rocking curve measurement, the FWHM (full-width-half-maximum) was measured to decrease from 140 arc-second to 20 arc-second after annealing in oxygen ambient at 1200° C. for 1 hour. The narrow FWHM indicates a much improved crystallinity in the samples. However, threading dislocations and sub-boundaries that originate and end on both overlying and underlying SiO2 interfaces cannot be annealed off. They are eliminated by the following procedure. (Step 6 FIG. 6)

The strips 38 in the encapsulating SiO2 layer 36 are then etched away to expose the upper surface 42 of the recrystallized Si film 34 at the localized area of the defects. (See FIG. 4 and Step 7 FIG. 6)

An ion implant of Si sufficient to amorphize the exposed Si strips 42. $^{30}Si^{30}$ ions are usually used as implantation species so as to avoid $N_2^+$ and $CO^+$ impurity ion implantations. Typically, for a 0.5 micron Si layer, a complete amorphization occurs at a dose equal to or higher than $1 \times 10^{16} cm^{-2}$ for 200 keV ions. (Step 8 FIG. 6)

A solid phase epitaxy process (SPE) at about 500°-700° C. in $N_2$ or Ar is then employed to transform the amorphous strips 42 to single crystal Si by regrowth from both sides of the amorphized region (Step 9 FIG. 6) The lateral growth rate for Si (undoped) is given by the following equation:

$$\mu(\text{growth rate}) = 2.89 \times 10^8 \exp\left(\frac{-2.68 \pm 0.05 eV}{kT}\right) cm/sec$$

where k=Boltzmann's constant and T=absolute temperature in degrees K. Solving this equation at 550° C. annealing temperature, $\mu = 1 Å/sec$. For a 3 micron strip, about 5 hours are required for lateral growth from both sides at 550° C. Using this process of entrainment, followed by implantation and SPE from defect-free areas, the sub-boundaries and crystal defects have been eliminated.

One can also use rapid thermal annealing to perform SPE. In this case, the growth rate at 1100° C., can be over tens of microns per second.

Preferably, the structure is then processed by removing the remaining SiO2 layer 36 (Step 10 FIG. 6) and then edge cutting and thinning the wafer 10 (Step 11 FIG. 6) to produce a defect-free SOI structure as shown in FIG. 5.

EQUIVALENTS

This completes the description of the preferred embodiments of the invention. While the invention has been particularly shown and described with reference to such embodiments, it should be understood that those skilled in the art will be capable of devising various changes in form and detail without departing from the spirit and scope of the invention.

We claim:

1. A method of zone melting and recrystallization of semiconductor film formed on an insulator over a silicon substrate comprising the steps of:
   a. forming a protective capping layer over the semiconductor film;
   b. zone melting and recrystallizing said film to transform said film to a single crystal, or nearly single crystalline structure;
   c. removing the protective capping layer, in selected regions where it is desired to selectively amorphize and regrow underlying structure to minimize crystalline defects, to expose the single crystal or nearly single crystal underlying structure in said regions;
   d. selectively amorphizing the exposed underlying structure while leaving single crystal or nearly single crystal regions laterally adjacent thereto;
   e. laterally regrowing said selectively amorphized structure to transform the amorphized structure to single crystal or nearly single crystal material seeded by the single crystal or nearly single crystal regions laterally adjacent thereto.

2. The method of claim 1 further comprising the step of annealing the structure after the zone melting and recrystallization step.

3. A method of reducing sub-boundary and grain boundary defects in zone melting and recrystallization of semiconductor film formed on an insulator over a silicon substrate comprising the steps of:
   a. forming a first layer over the semiconductor film;
   b. zone melting and recrystallizing said film to transform said film to a single crystal, or nearly single crystalline film;
   c. selectively removing the first layer, in selected regions, to expose the recrystallized underlying film of said selected regions;
   d. amorphizing only the exposed underlying film as said selected regions while leaving single crystal or nearly single crystal regions laterally adjacent thereto;
   e. regrowing said selectively amorphized regions to transform the amorphized regions to single crystal or nearly single crystal material, said growth being seeded by the single crystal or nearly single crystal regions laterally adjacent thereto to reduce defects which may have occurred during the melting and recrystallization of said film.

4. The method of claim 3 further comprising the step of annealing the structure after the zone melting and recrystallization step.

5. The method of claim 3 further comprising the step of forming said defects primarily in the selected regions.

6. The method of claim 5 wherein the defects are formed by forming steps along said first layer and locating the selected regions beneath said strips.

7. The method of claim 5 wherein the film is polysilicon prior to being transformed.

8. A method of zone melting and recrystallization of semiconductor film formed on an insulator over a substrate comprising the steps of:
   a. forming a first layer over the film;
   b. zone melting and recrystallizing said film to transform said film to single crystal, or nearly single crystalline silicon structure with crystal defects primarily formed beneath selected regions of said layer;
   c. forming openings at said selected regions to expose the underlying transformed structure;
   d. amorphizing the exposed underlying silicon structure leaving single crystal or nearly single crystalline material laterally adjacent the amorphized structure;
   e. laterally regrowing said amorphized structure seeded by the single crystal, or nearly single crystal material laterally adjacent thereto.

9. The method of claim 8 wherein the semiconductor film is polysilicon before transformation.

10. The method of claim 8 wherein the crystal defects are previously formed beneath strips formed over said selected regions.

* * * * *